US008958500B2

(12) United States Patent
Huang et al.

(10) Patent No.: US 8,958,500 B2
(45) Date of Patent: Feb. 17, 2015

(54) PEAK-TO AVERAGE POWER RATIO REDUCTION FOR WIRELESS COMMUNICATION SYSTEMS (75) Inventors: Xiaojing Huang, North Ryde (AU); Yingjie Jay Guo, Beecroft (AU); Jian Zhang, Beecroft (AU)

(73) Assignee: Commonwealth Scientific and Industrial Research Organisation, Campbell (AU)

( * ) Notice: Subject to any disclaimer, the term of this patent is extended or adjusted under 35 U.S.C. 154(b) by 0 days.

(21) Appl. No.: 13/515,920

(22) PCT Filed: Nov. 19, 2010

(86) PCT No.: PCT/AU2010/001562
§ 371 (c)(1),
(2), (4) Date: Aug. 8, 2012

(87) PCT Pub. No.: WO2012/065207
PCT Pub. Date: May 24, 2012

(65) Prior Publication Data
US 2012/0307925 A1 Dec. 6, 2012

(51) Int. Cl.
*H04L 25/49* (2006.01)
*H03G 7/00* (2006.01)
*H03G 3/30* (2006.01)
*H04L 27/26* (2006.01)
(52) U.S. Cl.
CPC ............. *H03G 7/007* (2013.01); *H03G 3/3042* (2013.01); *H04L 27/2623* (2013.01); *Y02B 60/50* (2013.01)
USPC ........................................................ 375/297

(58) Field of Classification Search
CPC .................. H04L 27/2624; H03F 2200/66
USPC ................... 375/297, 260, 296, 346; 455/571
See application file for complete search history.

(56) References Cited

U.S. PATENT DOCUMENTS

2004/0141548 A1    7/2004  Shattil
2004/0218689 A1*  11/2004  Akhtman ................ 375/296
2008/0112496 A1*   5/2008  Devlin et al. ............ 375/260

FOREIGN PATENT DOCUMENTS

EP          1469649        10/2004

OTHER PUBLICATIONS

International Bureau of WIPO, International Preliminary Report on Patentability, (2 pgs.), Written Opinion of the International Searching Authority (4 pgs.), May 21, 2013.
Australian Patent Office, International Search Report, PCT/AU2010/001562, Dec. 23, 2010, (2 pgs).
Liu, C., et al., "A Survey on OFDM Papr Reduction Techniques for 60 GHz Wireless CMOS Radio", Australasian Telecommunication Networks and Applications Conference, 2007, pp. 317-321.

(Continued)

*Primary Examiner* — Khai Tran
(74) *Attorney, Agent, or Firm* — Wood, Herron & Evans, LLP (57) ABSTRACT Disclosed is a wireless communication signal peak-to-average power ratio reduction, method. The method comprises calculating a peak envelope from an envelope of an input signal using a clipping threshold; smoothing the peak envelope using a window function; mapping the smoothed peak envelope to an attenuation function using the clipping threshold; and applying the attenuation function to the input signal.

13 Claims, 9 Drawing Sheets (56) References Cited

OTHER PUBLICATIONS

Walambe, A., et al., "A Simple Algorithm for the Reduction of the Peak Power in a Many Carrier AM-OFDM Signal", 2001 IEEE, pp. 1709-1713.

Rodrigues, M.R.D., et al., "A Novel Coding Strategy to Improve the Error Probability Performance of Non-linearly Distorted OFDM Signals", 2003 IEEE, pp. 294-298.

Al-kebsi, I.I., et al., "A novel Algorithm with a New Adaptive Modulation Form to Improve the Performance of OFDM for 4G Systems", 2009 International Conference on Future Computer and Communication, 2009 IEEE, pp. 11-15.

Cha, S., et al., "A New PAPR Reduction Technique for OFDM Systems Using Advanced Peak Windowing Method", 2008 IEEE, pp. 405-410.

Lee, H., et al., "A New Construction of 64-QAM Golay Complementary Sequences", Correspondence, IEEE Transactions on Information Theory, vol. 52, No. 4, 2006, pp. 1663-1670.

Vadali, S.R.K., et al., "A Low Complexity PAPR Reduction Scheme without Side Information for Pilot Assisted OFDM Systems", 2008 IEEE Region 19 Colloquium and the Third ICIIS, pp. 1-4.

Li, Y., et al., A De-Cresting Technique for Polar Transmitters Using Envelope-Tracking (ET) and SiGe Power Amplifiers for Mobile WiMax, COMCAS 2009, pp. 1-4.

Hao, M-J., et al., A Companding Technique for PAPR Reduction of OFDM Systems, 2006 International Symposium on Intelligent Signal Processing and Communication Systems, pp. 634-637.

Kliks, A., et al., "New metrics reflecting the nonlinear distortions in OFDM transmission", 2008 IEEE, pp. 21-25.

Jha, A., et al., "Reduction of Peak to Average Power Ratio (PAPR) in Orthogonal Frequency Division Multiplexing (OFDM); A Novel Approach Based on Clipping and Amplification", 2009 Fourth International Conference on Computer Sciences and Convergence Information Technology, pp. 921-926.

van Nee, R., et al., "Reducing the Peak-to-Average Power Ration of OFDM", 1998 IEEE, VTC '98, pp. 2072-2076.

Ke, Z., et al., "Reducing of peak-to-average power radio of OFDM system with pseudorandom sequence", 2008 IEEE, pp. 1-4.

Kaiho, H., et al., "Reduced Complexity of Spread Spectrum OFDM for PAPR Reduction and Its Basic Performance", 2009 IEEE, TENCON 2009, pp. 1-5.

Lashkarian N., et al., "Reconfigurable Digital Front-End Hardware for Wireless Base-Station Transmitters: Analysis, Design and FPGA Implementation", IEEE Transactions on Circuits and Systems—I: Regular Papers, vol. 54, No. 8, 2007, pp. 1666-1677.

Nikookar, H., et al., "Random Phase Updating Algorithm for OFDM Transmission With Low PAPR", IEEE Transactions on Broadcasting, vol. 48, No. 2, 2002, pp. 123-128.

Choe, K.D., et al., "Pre-Scrambling Method for PAPR Reduction in OFDM Communication Systems", IEEE Transactions on Consumer Electronics, vol. 50, No. 4, 2004, pp. 1044-1048.

Won, J., et al., "Portable Internet as Next Generation Network", 2005 Asia-Pacific Conference on Communications, 2005, pp. 911-915.

Hung, H-L., et al., "Performance of Particle Swarm Optimization Techniques on PAPR Reduction for OFDM Systems", International Conference on Systems, Man and Cybernetics, 2008 IEEE, pp. 2390-2395.

Chanda, D., et al., "Performance of Clipped OFDM Signal in Fiber", 2004 IEEE, pp. 2401-2404.

Jiang, W., et al., "Performance Improvement of Power Amplifiers with Digital Linearization Technology", Proceedings of Asia-Pacific Microwave Conference 2007, IEEE, pp. 1-4.

Park, Y-S, et al., "Peak-to-Average Power Ratio Suppression Schemes in DFT Based OFDM", 2000 IEEE, VTC 2000, pp. 292-297.

Liu, P., et al., "Peak-to-Average Power Ration Reduction of FDRM", Proceedings of 2005 International Symposium on Intelligent Signal Processing and Communication Systems, 2005, IEEE, pp. 429-432.

Hassan, E.S., et al., "Peak-to-average power ratio reduction in space-time block coded multi-input multi-output orthogonal frequency division multiplexing systems using a small overhead selective mapping scheme", IET Commun., vol. 3, No. 10, 2009, pp. 1667-1674.

Akhtman, J., et al., "Peak-to-Average Power Ratio Reduction for OFDM Modems", 2003 IEEE, VTC '03, pp. 1188-1192.

Lashkarian, N., et al., "Peak to Average Power Ratio Reduction in multi-band Transmitters; Analysis, Design and FPGA Implementation", IEEE Globecom 2005, pp. 2169-2173.

Juwono, F.H., et al., "PAPR Reduction Using Huffman Coding Combines with Clipping and Filtering for OFDM Transmitter", 2009 Conference on Innovative Technologies in Intelligent Systems and Industrial Applications, 2009 IEEE, pp. 344-347.

Ojima, M., et al., "PAPR Reduction Method using Clipping and Peak-windowing in CI/OFDM System", 2007 IEEE, pp. 1356-1360.

Rodrigues, M.R.D., et al., "Optimum Receivers for Non-Linearly Distorted OFDM Signals", 2004 IEEE, pp. 1223-1227.

Kuo, H., et al., "Optimization of Windowing and Peak-Windowing Techniques for WCDMA Systems", 2006 IEEE, ICASSP 2006, pp. IV-313-IV-316.

Wu, J-M., et al., "Novel Time Domain 3B/4B Precoding for Efficient PAPR Reduction in OFDM Communication Systems", China Com 2008, pp. 1-5.

Kaiho, H., et al., "Novel Scheme of Oversampling Spread Spectrum Roll-off OFDM for PAPR Reduction", 2009 IEEE, pp. 1-5.

Tsai, Y-C, et al., "Turbo Coded OFDM for Reducing PAPR and Error Rates", IEEE Transactions on Wireless Communications, vol. 7, No. 1, 2008, pp. 84-89.

Al-kebsi, I.I.M., et al., "The Impact of Modulation Adaptation and Power Control on PAPR Clipping Technique in OFDM of 4G Systems", Proceedings of IEEE 2008 6th National Conference on Telecommunication Technologies and IEEE 2008 2nd Malaysia Conference on Photonics, 2008, pp. 295-299.

Soriano, R.D., et al., "The Effect of Signal Distortion Techniques for PAPR Reduction on the BER Performance of LDPC and Turbo Coded OFDM System", 2006 IEEE, pp. 1-4.

Tang, T., "The block coding used in OFDM system to reduce the PAPR", 2006 IEEE, pp. 1-4.

Schenk, T.C.W., et al., "The Application of Spatial Shifting for Peak-to-Average Power Ration Reduction in MIMO OFDM Systems", 2006 IEEE, pp. 1859-1863.

Marsili, S., "Technique for Peak to average Power Ratio Reduction suited for M-carrier WCDMA Base Staten Transmitters", 2007 IEEE, pp. 3522-3525.

Rodrigues, M.R.D., et al., "SLM and PTS Based on an IMD Reduction Strategy to Improve the Error Probability Performance of Non-Linearly Distorted OFDM Signals", IEEE Communications Society, 2004, pp. 857-861.

Väänänen, O., et al., "Simple algorithm for peak windowing and its application in GSM, EDGE and WCDMA systems", IEE Proc.-Commun., vol. 152, No. 3, 2005, pp. 357-362.

Alsusa, E., et al., "Selective post-IFFT amplitude randomizing for peak-to-average power ratio reduction in orthogonal frequency-division multiplexing-based systems", IET Commun., vol. 2, No. 4, 2008, pp. 553-561.

Pauli, M., et al., "Minimization of the Intermodulation Distortion of a Nonlinearly Amplified OFDM Signal", Wireless Personal Communications vol. 4, 1996, pp. 93-101.

Chen, G., et al., "Improved Peak Windowing for PAPR Reduction in OFDM", 2009 IEEE, pp. 1-5.

Rodrigues, M.R.D., et al., "IMD Reduction with SLM and PTS to Improve the Error-Probability Performance of Nonlinearly Distorted OFDM Signals", IEEE Transactions on Vehicular Technology, vol. 55, No. 2, 2006, pp. 537-548.

Rodrigues, M.R.D., et al., "IMD reduction coding to improve the error probability performance of nonlinearly distorted OFDM signals", IEE Proc.-Commun., vol. 152, No. 5, 2005, pp. 559-566.

O'Neill, R., et al., "Envelope Variations and Spectral Splatter in Clipped Multicarrier Signals", 1995 IEEE, pp. 71-75.

Kim, W-J., et al., "Doherty Feed-Forward Amplifier Performance Using a Novel Crest Factor Reduction Technique", IEEE Microwave and Wireless Components Letters, vol. 17, No. 1, 2007, pp. 82-84.

Bogucka, H., "Directions and Recent Advances in PAPR Reduction Methods", 2006 IEEE International Symposium on Signal Processing and Information Technology, pp. 821-827.

(56) References Cited

OTHER PUBLICATIONS

Chen, Y-C., et al., "Cross-layer Design for Joint PAPR Reduction and Multi-resolution Resource Assignment", 2009 IEEE, pp. 1-5.

Thompson, S.C., et al, "Constant Envelope OFDM", IEEE Transactions on Communications, vol. 56, No. 8, 2008, pp. 1300-1312.

Thompson, S.C., et al., "Constant Envelope Binary OFDM Phase Modulation", 2003 IEEE, pp. 621-626.

Stewart, B.G., et al., "BER Performance Evaluation of Tail-Biting Convolution Coding Applied to Companded QPSK Mobile WiMax", 2009 15th International Conference on Parallel and Distributed Systems, pp. 734-739.

Rahmatallah, Y., et al., "ARMA Companding Scheme with Improved Symbol Error Rate for PAPR Reduction in OFDM Systems", 2010 IEEE, pp. 1-6.

Zhou, Q., et al., "Application Research of COFDM Modulation Technology on the Power Line Carrier Communication", Proceedings of the 6th International Conference on Advances in Power System Control, Operation and Management, 2003, pp. 647-652.

Rahim, M.U., et al., "Analysis of Clipping-based PAPR-Reduction in Multicarrier Systems", 2009 IEEE, pp. 1-5.

Jiang, T., et al., "An Overview: Peak-to-Average Power Ratio Reduction Techniques for OFDM Signals", IEEE Transactions on Broadcasting, vol. 54, No. 2, 2008, pp. 257-268.

Ruangsurat, N., et al., "An Investigation of Peak to Average Power Ratio in MC-CDMA Combined with Partial Transmit Sequence", 2001 IEEE, VTC '01, pp. 761-765.

Zhang, Y., et al., "An Intelligent Genetic Algorithm for PAPR Reduction in a Multi-Carrier CDMA Wireless System", 2008 IEEE, pp. 1052-1057.

Sakran, H., et al., "An Efficient Technique for Reducing PAPR of OFDM System in the Presence of Nonlinear High Power Amplifier", ICSP 2008 Proceedings, 2008 IEEE, pp. 1749-1752.

Marsili, S., "Algorithm for Peak to Average Power Ratio Reduction Operating at Symbol Rate", 2005 IEEE, pp. 5497-5500.

\* cited by examiner

PEAK-TO AVERAGE POWER RATIO REDUCTION FOR WIRELESS COMMUNICATION SYSTEMS

TECHNICAL FIELD

The present invention relates generally to wireless communication systems and, in particular, to the reduction of peak-to-average power ratio in wireless communication systems.

BACKGROUND

In a wireless communication system, a high power amplifier (HPA) is used to boost the signal power to the level necessary for transmission over the required communication range. To achieve the maximum power efficiency, the HPA is required to operate at or near the saturation point. However, an HPA cannot deliver an increased output power beyond the saturation point even with increased input signal level. Thus, the input signal average power should produce an output power at or near the saturation point of the HPA. If the input signal has amplitude variation with high peak-to-average power ratio (PAPR), the transmitted power of the HPA must be backed off from the saturation point by an amount proportional to the PAPR, thus reducing power efficiency. Otherwise, the non-linearity caused by the saturation will introduce inter-modulation components in the signal frequency band, cause signal distortion, and hence degrade system performance. In a digital communication system, a signal with large PAPR also has a large dynamic range, which requires the use of high quality analog-to-digital and digital-to-analog converters, resulting in increased complexity and cost. Therefore, reducing the PAPR of the input signal to the HPA is an important way to improve power efficiency, increase communication range, reduce power consumption, and reduce cost and complexity for a wireless communication system.

Orthogonal frequency-division multiplexing (OFDM) and code-division multiple access (CDMA) are two widely used wireless communication techniques. OFDM and its multi-user version, orthogonal frequency-division multiple access (OFDMA), offer high spectral efficiency, robustness against multipath propagation and channel fading, and low implementation complexity. However, an OFDM/OFDMA signal typically exhibits a large PAPR, which is one of the primary disadvantages of such systems. CDMA allows multiple users to share a communication channel with each user's data symbols "spread" by a spreading code. Signals intended for different users using their respective spreading codes are combined together at the base station for downlink transmission. As the number of users increases, the combined signal also exhibits a large PAPR.

A number of PAPR reduction techniques have been proposed in the literature. These techniques include clipping, coding, phase optimization, nonlinear companding, tone reservation and tone injection, constellation shaping, partial transmission sequence and selective mapping. Among these techniques, clipping and its variant, peak windowing, are the most straightforward ways to reduce the PAPR of a signal. These techniques are widely applied in practical systems due to the following advantages. First, they do not require any side information about date modulation or any redundant dummy code or subcarrier to be transmitted, and hence there is no loss of data rate or spectral efficiency after PAPR reduction. Second, they do not require iterative computation, and hence have lower complexity than the other techniques. Third, they do not require any modification of the receiver structure, and can be applied to any signal waveform in any wireless communication system, including OFDM/OFDMA and CDMA systems.

However, the clipping technique introduces both in-band distortion and out-of-band radiation. Though filtering after clipping can reduce the out-of-band radiation, it can also cause peak re-growth after filtering and increase the complexity. The peak windowing variant produces much less out-of-band radiation, but may cause over-attenuation or under-attenuation of the input signal.

SUMMARY

Disclosed are methods and devices for reducing the peak-to-average power ratio of a signal in a wireless communication system that substantially overcome, or at least ameliorate, one or more disadvantages of existing arrangements. A feature of the disclosed arrangements is the calculation of an attenuation function to be applied to the signal based on a smoothed peak envelope obtained from the signal.

According to a first aspect of the present disclosure, there is provided a wireless communication signal peak-to-average power ratio reduction method. The method comprises calculating a peak envelope from an envelope of an input signal using a clipping threshold; smoothing the peak envelope using a window function; mapping the smoothed peak envelope to an attenuation function using the clipping threshold; and applying the attenuation function to the input signal.

According to a second aspect of the present disclosure, there is provided a wireless communication signal peak-to-average power reduction device comprising a module configured to: calculate a peak envelope from an envelope of an input signal using a clipping threshold; smooth the peak envelope using a window function; map the smoothed peak envelope to an attenuation function using the clipping threshold; and apply the attenuation function to the input signal.

DESCRIPTION OF THE DRAWINGS

Embodiments of the present invention will now be described with reference to the drawings, in which:

FIGS. 3A and 313 collectively form a schematic block diagram representation of an embedded computing device as which the PAPR reduction modules of FIGS. 1 and 2 may be implemented;

DETAILED DESCRIPTION

Where reference is made in any one or more of the accompanying drawings to steps and/or features, which have the same reference numerals, those steps and/or features have for the purposes of this description the same function(s) or operation(s), unless the contrary intention appears.

Figure 1:
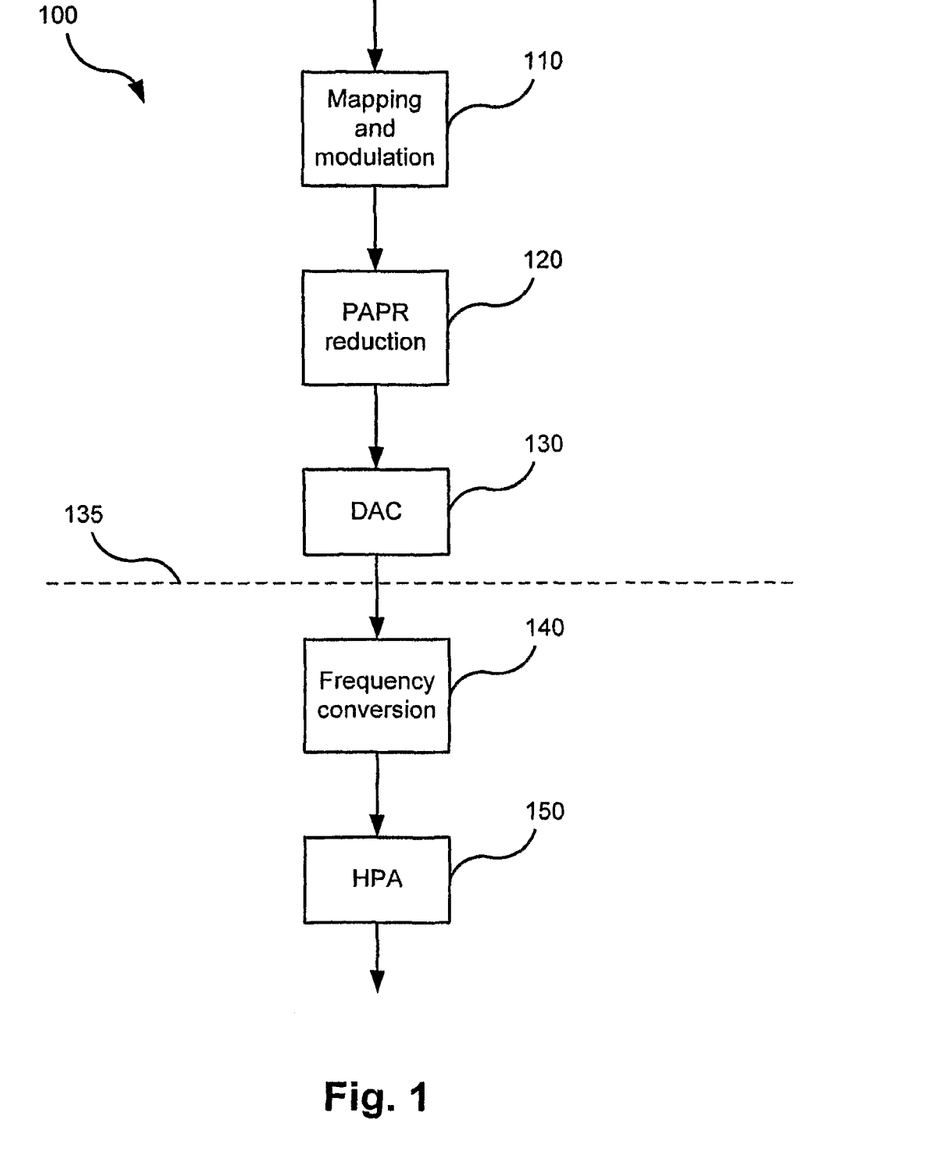
FIG. 1 shows a transmitter for a wireless communication system, in which the embodiments may be practiced.

FIG. 1 shows a transmitter 100 for a wireless communication system in which the embodiments may be practiced. The transmitter 100 comprises a digital sub-system (comprising the modules above the dashed line 135) and a radio frequency (RF) sub-system (comprising the modules below the dashed line 135). In the transmitter 100, PAPR reduction is performed in the digital sub-system. The input data bits are mapped to symbols and modulated by the mapping and modulation module 110 to produce a digital waveform which is a complex-valued baseband signal or a real-valued intermediate frequency (IF) signal, depending on system design considerations. The digital waveform is then passed through a PAPR reduction module 120 to produce a PAPR-reduced digital waveform. The PAPR-reduced digital waveform is converted into an analog waveform by the digital-to-analog conversion (DAC) module 130 and enters the RF sub-system. In the RF sub-system, the frequency conversion module 140 converts the analog waveform to an RF signal. The RF signal is then amplified by a high power amplifier (HPA) 150 for transmission by a transmitter antenna (not shown). Since the RF signal input to the HPA 150 has lower PAPR due the PAPR reduction performed by the PAPR reduction module 120, the HPA 150 can have less back-off and hence higher power efficiency.

Figure 2:
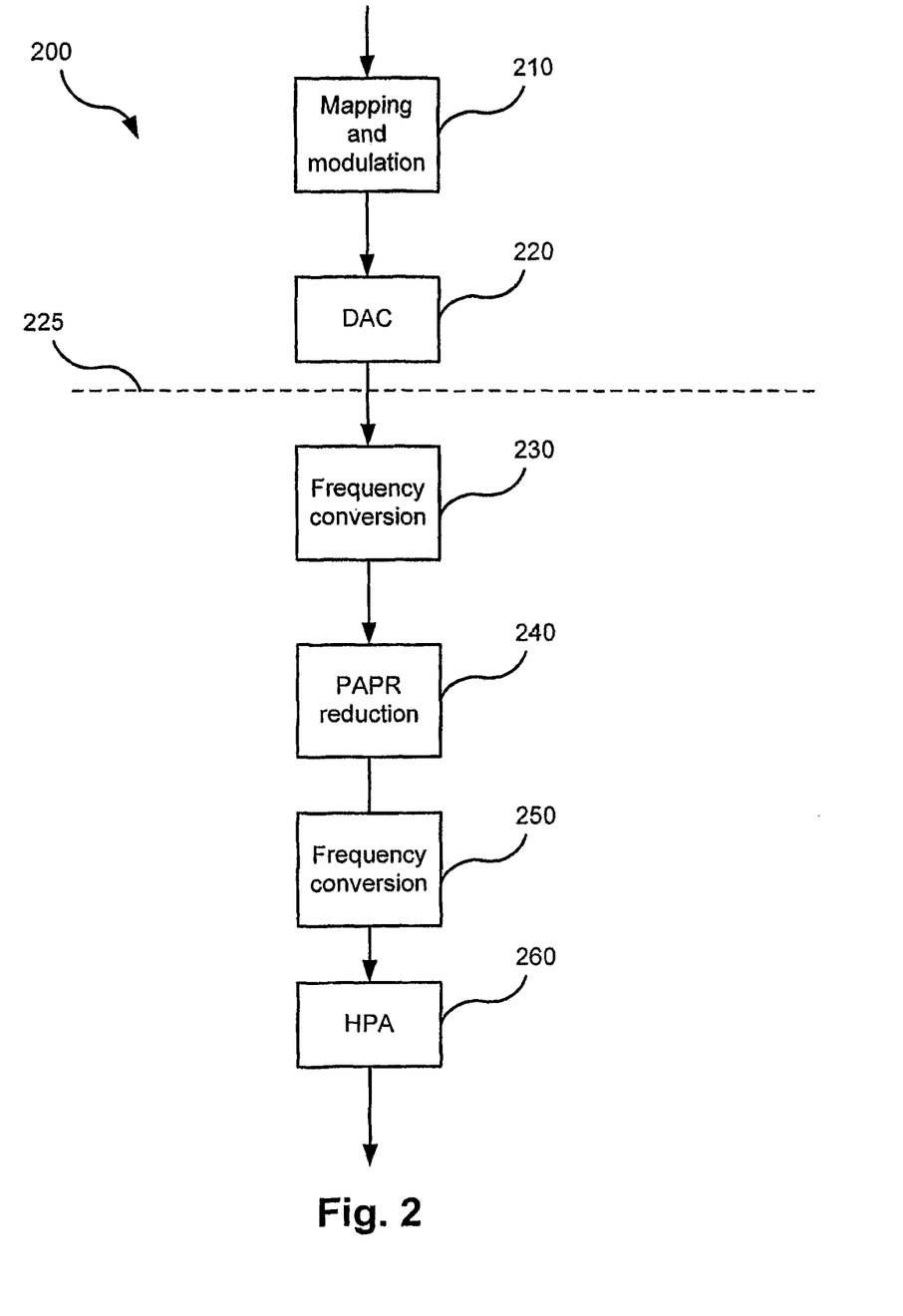
FIG. 2 shows an alternative transmitter for a wireless communication system, in which the embodiments may also be practiced.

FIG. 2 shows an alternative transmitter 200 for a wireless communication system in which the embodiments may also be practiced. The transmitter 200 also comprises a digital sub-system (comprising the modules above the dashed line 225) and a radio frequency (RF) sub-system (comprising the modules below the dashed line 225). In the transmitter 200, PAPR reduction is performed at the IF stage in the RF sub-system. The input data bits are mapped to symbols and modulated by the mapping and modulation module 210 to produce a digital waveform which is a complex-valued baseband signal or a real-valued intermediate frequency (IF) signal, depending on system design considerations. The digital waveform is converted into an analog waveform by the digital-to-analog conversion (DAC) module 220 and enters the RF sub-system. In the RF sub-system, the first frequency conversion module 230 converts the analog waveform to an analog IF signal. The analog IF signal is then passed through a PAPR reduction module 240 to produce a PAPR-reduced IF signal. Further frequency conversion is performed by the second frequency conversion module 250 to convert the PAPR-reduced IF signal to an RF signal. The RF signal is then amplified by an HPA 260 for transmission by a transmitter antenna (not shown). Since the RF signal input to the HPA 260 has lower PAPR due the PAPR reduction performed by the PAPR reduction module 240, the HPA 260, like the HPA 150 in the transmitter 100, can have less back-off and hence higher power efficiency.

The disclosed arrangements for PAPR reduction operate in the digital domain, so the PAPR reduction module 240, which operates in the RF sub-system, includes analog-to-digital conversion (ADC) at its input and DAC at its output, but is otherwise the same as the PAPR reduction module 120 that operates in the digital sub-system.

Figure 3A:
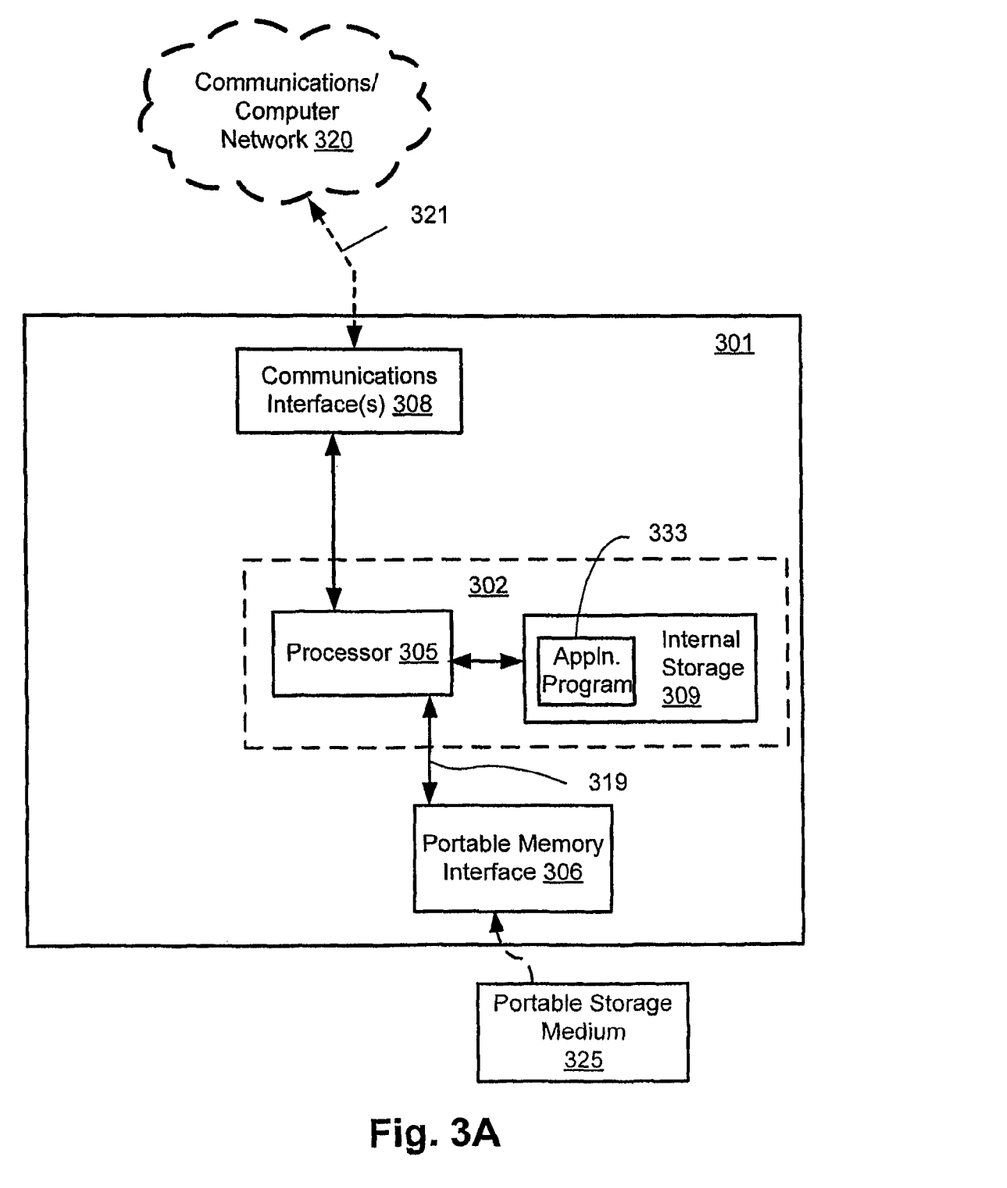
Figure 3B:
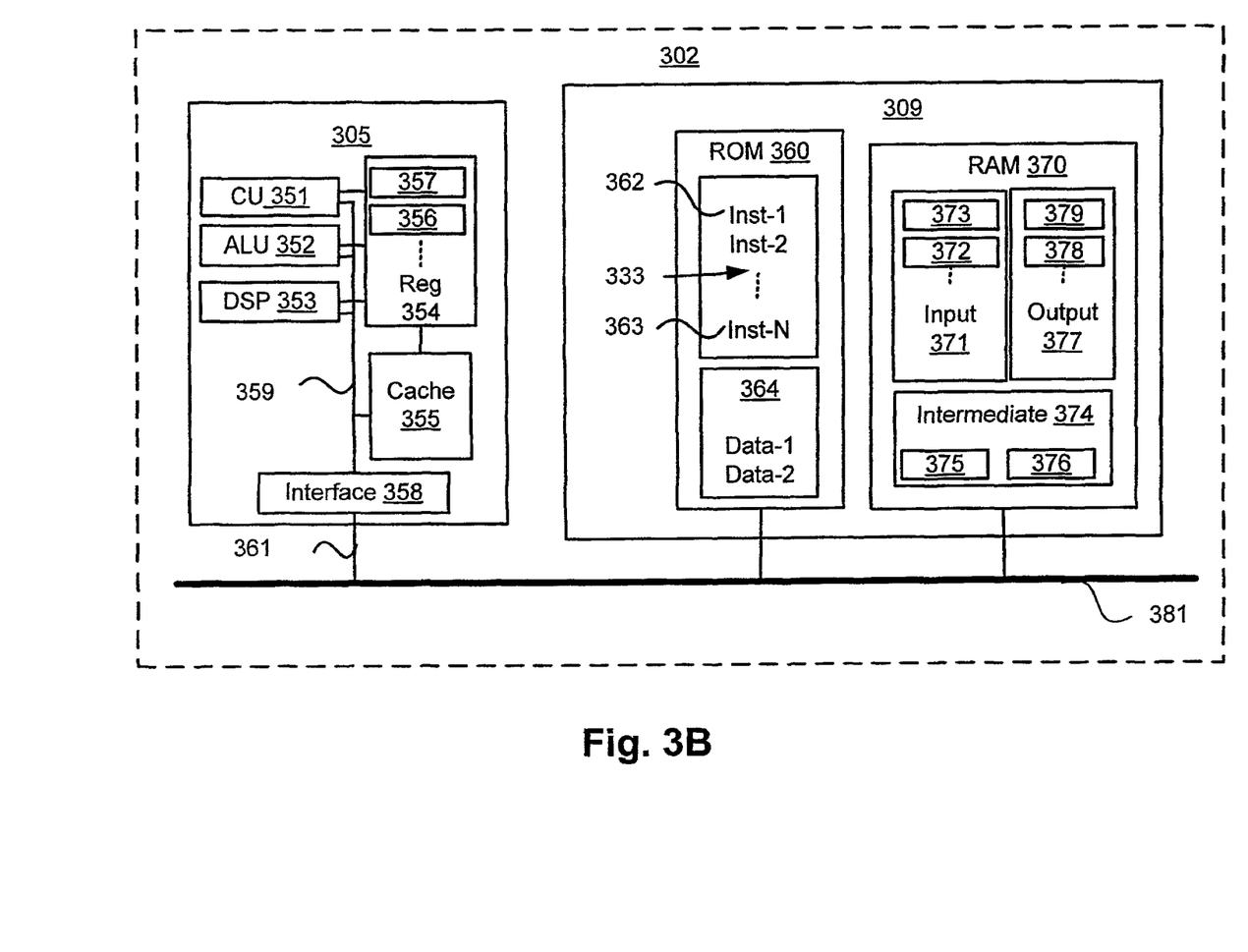

FIGS. 3A and 3B collectively form a schematic block diagram of an embedded computing device 301, as which the PAPR modules 120 and 240 of FIGS. 1 and 2 respectively may be implemented. As seen in FIG. 3A, the electronic device 301 comprises an embedded controller 302. Accordingly, the electronic device 301 may be referred to as an "embedded device." The controller 302 has a processing unit (or processor) 305 which is bi-directionally coupled to an internal storage module 309. The storage module 309 may be formed from non-volatile semiconductor read only memory (ROM) 360 and semiconductor random access memory (RAM) 370, as seen in FIG. 3B. The RAM 370 may be volatile, non-volatile or a combination of volatile and non-volatile memory.

As seen in FIG. 3A, the electronic device 301 also comprises a portable memory interface 306, which is coupled to the processor 305 via a connection 319. The portable memory interface 306 allows a complementary portable computer readable storage medium 325 to be coupled to the electronic device 301 to act as a source or destination of data or to supplement the internal storage module 309. Examples of such interfaces permit coupling with portable computer readable storage media such as Universal Serial Bus (USB) memory devices, Secure Digital (SD) cards, Personal Computer Memory Card International Association (PCMIA) cards, optical disks and magnetic disks.

The electronic device 301 also has a communications interface 308 to permit coupling of the electronic device 301 to a computer or communications network 320 via a connection 321. The connection 321 may be wired or wireless. For example, the connection 321 may be radio frequency or optical. An example of a wired connection includes Ethernet. Further, an example of wireless connection includes Bluetooth™ type local interconnection, Wi-Fi (including protocols based on the standards of the IEEE 802.11 family), Infrared Data Association (IrDa) and the like. The methods described hereinafter may be implemented using the embedded controller 302, as one or more software application programs 333 executable within the embedded controller 302. In particular, with reference to FIG. 3B, the steps of the described methods are effected by instructions in the software 333 that are carried out within the embedded controller 302. The software instructions may be formed as one or more code modules, each for performing one or more particular tasks.

The software 333 of the embedded controller 302 is typically stored in the non-volatile ROM 360 of the internal storage module 309. The software 333 stored in the ROM 360 can be updated when required from a computer readable medium. The software 333 can be loaded into and executed by the processor 305. In some instances, the processor 305 may execute software instructions that are located in RAM 370. Software instructions may be loaded into the RAM 370 by the processor 305 initiating a copy of one or more code modules from ROM 360 into RAM 370. Alternatively, the software instructions of one or more code modules may be pre-installed in a non-volatile region of RAM 370 by a manufacturer. After one or more code modules have been located in RAM 370, the processor 305 may execute software instructions of the one or more code modules.

The application program 333 is typically pre-installed and stored in the ROM 360 by a manufacturer, prior to distribution of the electronic device 301. However, in some instances, the application programs 333 may be supplied to the user encoded on the computer readable storage medium 325 and read via the portable memory interface 306 of FIG. 3A prior to storage in the internal storage module 309. "Computer readable storage medium" refers to any non-transitory tangible storage medium that participates in providing instructions and/or data to the embedded controller 302 for execution and/or processing. Examples of such storage media include floppy disks, magnetic tape, CD-ROM, DVD, a hard disk drive, a ROM or integrated circuit, USB memory, a magneto-optical disk, semiconductor memory, or a computer readable card such as a PCMCIA card and the like, whether or not such devices are internal or external to the electronic device 301. A computer readable storage medium having such software or computer program recorded on it is a computer program product. The use of such a computer program product in the electronic device 301 effects a device for reducing the PAPR of a signal.

In another alternative, the software application program 333 may be read by the processor 305 from the network 320, or loaded into the embedded controller 302 from other computer readable transmission media. Examples of transitory or non-tangible computer readable transmission media that may also participate in the provision of software, application programs, instructions and/or data to the electronic device 301 include radio or infra-red transmission channels as well as a network connection to another computer or networked device, and the Internet or Intranets including e-mail transmissions and information recorded on Websites and the like.

FIG. 3B illustrates in detail the embedded controller 302 having the processor 305 for executing the application programs 333 and the internal storage 309. The internal storage 309 comprises read only memory (ROM) 360 and random access memory (RAM) 370. The processor 305 is able to execute the application programs 333 stored in one or both of the connected memories 360 and 370. When the electronic device 301 is initially powered up, a system program resident in the ROM 360 is executed. The application program 333 permanently stored in the ROM 360 is sometimes referred to as "firmware". Execution of the firmware by the processor 305 may fulfil various functions, including processor management, memory management, device management, storage management and user interface.

The processor 305 typically includes a number of functional modules including a control unit (CU) 351, an arithmetic logic unit (ALU) 352 and a local or internal memory comprising a set of registers 354 which typically contain atomic data elements 356, 357, along with internal buffer or cache memory 355. One or more internal buses 359 interconnect these functional modules. The processor 305 typically also has one or more interfaces 358 for communicating with external devices via system bus 381, using a connection 361.

The application program 333 includes a sequence of instructions 362 though 363 that may include conditional branch and loop instructions. The program 333 may also include data, which is used in execution of the program 333. This data may be stored as part of the instruction or in a separate location 364 within the ROM 360 or RAM 370.

In general, the processor 305 is given a set of instructions, which are executed therein. This set of instructions may be organised into blocks, which perform specific tasks or handle specific events that occur in the electronic device 301. Typically, the application program 333 waits for events and subsequently executes the block of code associated with that event. Events may be triggered in response to input from a user, via the user input devices 313 of FIG. 3A, as detected by the processor 305. Events may also be triggered in response to other sensors and interfaces in the electronic device 301.

The execution of a set of the instructions may require numeric variables to be read and modified. Such numeric variables are stored in the RAM 370. The disclosed method uses input variables 371 that are stored in known locations 372, 373 in the memory 370. The input variables 371 are processed to produce output variables 377 that are stored in known locations 378, 379 in the memory 370. Intermediate variables 374 may be stored in additional memory locations in locations 375, 376 of the memory 370. Alternatively, some intermediate variables may only exist in the registers 354 of the processor 305.

The execution of a sequence of instructions is achieved in the processor 305 by repeated application of a fetch-execute cycle. The control unit 351 of the processor 305 maintains a register called the program counter, which contains the address in ROM 360 or RAM 370 of the next instruction to be executed. At the start of the fetch execute cycle, the contents of the memory address indexed by the program counter is loaded into the control unit 351. The instruction thus loaded controls the subsequent operation of the processor 305, causing for example, data to be loaded from ROM memory 360 into processor registers 354, the contents of a register to be arithmetically combined with the contents of another register, the contents of a register to be written to the location stored in another register and so on. At the end of the fetch execute cycle the program counter is updated to point to the next instruction in the system program code. Depending on the instruction just executed this may involve incrementing the address contained in the program counter or loading the program counter with a new address in order to achieve a branch operation.

Each step or sub-process in the processes of the methods described below is associated with one or more segments of the application program 333, and is performed by repeated execution of a fetch-execute cycle in the processor 305 or similar programmatic operation of other independent processor blocks in the electronic device 301.

The methods described below may alternatively be implemented in dedicated hardware performing the functions or sub functions of the described methods. Such dedicated hardware may include a Field Programmable Gate Array (FPGA), an Application Specific Integrated Circuit (ASIC), or a digital signal processor configured to perform the described methods in conventional fashion.

The input (digital) signal is denoted as $x(n)$, which can be either a complex-valued baseband signal or a real-valued IF signal. A clipping threshold is defined as A, whose value is typically derived by multiplying the RMS value of the input signal $x(n)$ by the desired PAPR (e.g. 4 dB or 1.5849). The conventional clipping method for PAPR reduction involves the following two steps.

Step 1: Determine an attenuation function $c(n)$:

$$c(n) = \begin{cases} 1, & \text{if } |x(n)| \leq A \\ \dfrac{A}{|x(n)|}, & \text{if } |x(n)| > A \end{cases} \quad (1)$$

Step 2: Calculate the clipped output digital waveform $y(n)$ by multiplying the input waveform by the attenuation function:

$$y(n) = c(n)x(n) \quad (2)$$

Equation (1) shows that the attenuation function $c(n)$ always satisfies the condition $0 \leq c(n) \geq 1$.

Figure 4:
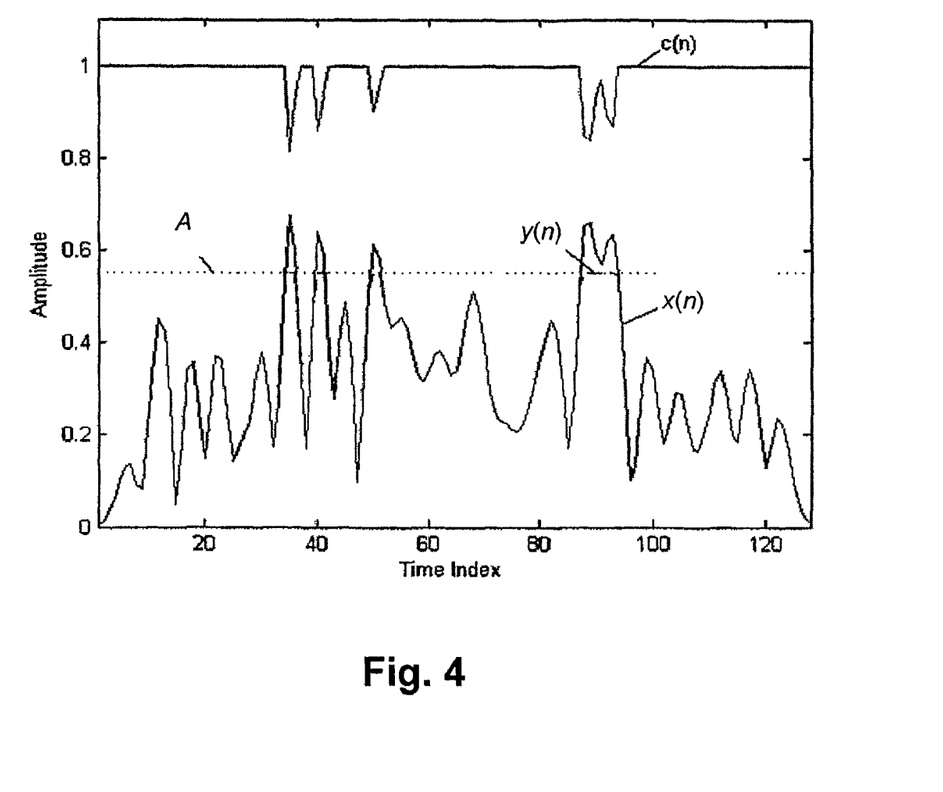
FIG. 4 shows the envelopes of an exemplary input signal to and output signal from the clipping method of PAPR reduction.

FIG. 4 shows the envelopes (moduli) of an exemplary input $x(n)$ to and output $y(n)$ from the clipping method of equations (1) and (2). The exemplary input $x(n)$ is a baseband OFDM symbol generated using 32 subcarriers with oversampling ratio of 4, so the total number of samples is 128. The average signal input power $E\{|x(n)|^2\}$ is 0.1215 and the clipping threshold A is 0.5524 (determined from $$\frac{A}{\sqrt{E\{|x(n)|^2\}}} = 1.5849 = 4 \text{ dB}\bigg).$$

FIG. 4 also shows the attenuation function c(n) that is applied to the input signal x(n).

The conventional clipping method described above limits the peak signal envelope of the input signal x(n) to the clipping threshold A, while leaving the rest of the input signal x(n) unaffected, so that the PAPR of x(n) is reduced. However, as shown in FIG. 4, the clipping method introduces sharp corners to the clipped signal y(n), which leads to distortion of the input signal x(n) and increases the out-of-band radiation (i.e., spectrum re-growth) after the clipped signal y(n) is frequency converted and transmitted by the antenna.

The (known) peak windowing variant of the clipping method addresses the spectrum re-growth problem of the clipping method by using a smoothed version of the attenuation function c(n) obtained from the clipping method. The peak windowing method involves the following five steps.

Step 1: Calculate the complementary attenuation function $\bar{c}(n)$ of the attenuation function of equation (1):

$$\bar{c}(n) = 1 - c(n) = \begin{cases} 0, & \text{if } |x(n)| \leq A \\ 1 - \frac{A}{|x(n)|}, & \text{if } |x(n)| > A \end{cases} \quad (3)$$

Step 2: Perform peak detection on $\bar{c}(n)$ to locate all peaks. Each peaks is represented by the peak location $n_i$ and the peak value $a_i$, which are determined by $$n_i = \arg\max_{n_{i-} \leq n < n_{i+}} \bar{c}(n) \quad (4)$$

$$a_i = \bar{c}(n_i) \quad (5)$$

where $n_{i-}$ denotes the time index of the rising edge of the i-th peak, at which $|x(n_{i-})|$ first goes above the clipping threshold A, and $n_{i+}$ denotes the time index of the falling edge of the i-th peak, at which $|x(n_{i+})|$ first goes below the clipping threshold A. The width of the i-th peak is $(n_{i+}-n_{i-})$.

Step 3: Convolve the peaks with a window function w(n) to obtain a smoothed complementary attenuation function $\bar{b}(n)$:

$$\bar{b}(n) = \sum_i a_i w(n - n_i) \quad (6)$$

The smoothed complementary attenuation function $\bar{b}(n)$ is a superposition of the peak-weighted window functions w(n).

Step 4: Calculate the smoothed attenuation function b(n):

$$b(n) = 1 - \bar{b}(n) \quad (7)$$

Step 5: Apply the smoothed attenuation function b(n) to the input signal x(n) to obtain the output signal y(n):

$$y(n) = b(n)x(n) \quad (8)$$

To ensure that the envelope of the output signal y(n) does not exceed the clipping threshold A, the smoothed attenuation function b(n) must satisfy $$b(n) \leq c(n) \quad (9)$$

With an appropriate choice of window function w(n), the peak windowing method can maintain the spectral characteristics of the input signal x(n) without significant spectral re-growth. However, the peak windowing method has some drawbacks, the most significant of which are summarised below.

First, if multiple peaks are located close together in $\bar{c}(n)$, the windows w(n) centred on respective peaks will be overlapped, and their superposition produces a larger smoothed complementary attenuation function $\bar{b}(n)$, which leads to a smaller smoothed attenuation function b(n) around these peaks. The smaller smoothed attenuation function b(n) causes over-attenuation of the input signal x(n). Equation (7) shows that if $\bar{b}(n)$ is larger than 1, b(n) can become negative.

Second, if the peak width is large or the window function w(n) is not properly selected, the smoothed attenuation function b(n) may not satisfy the condition in Equation (9), which means that the envelope of the output signal y(n) is not guaranteed to be less than the clipping threshold A, and the desired PAPR will not be met. This is known as "under-attenuation".

Figure 5:
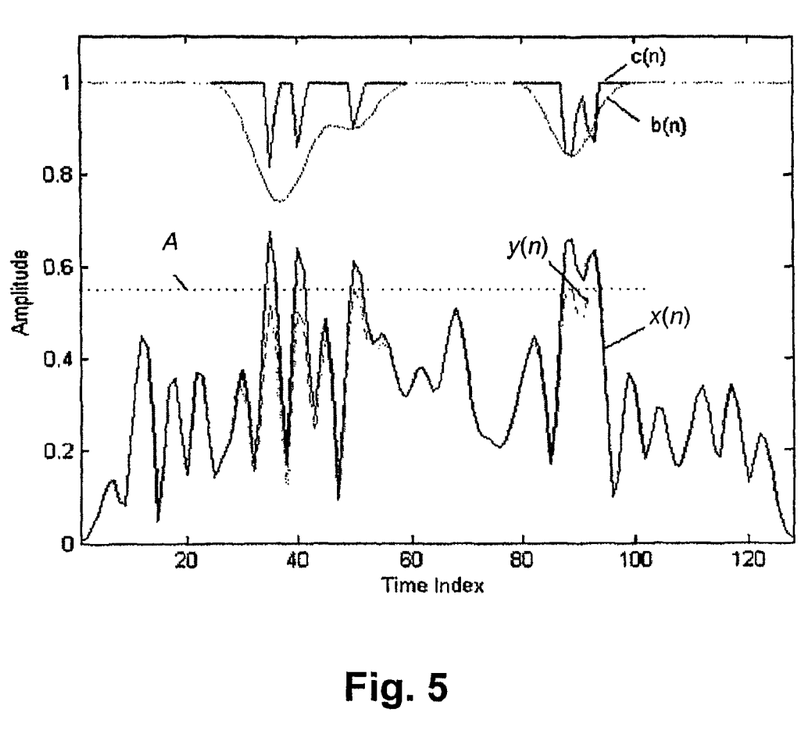
FIG. 5 shows the envelopes of an exemplary input signal to and output signal from the peak windowing method of PAPR reduction.

FIG. 5 shows the envelopes of an exemplary input signal x(n) to and output signal y(n) from the peak windowing method of equations (3) to (8). The exemplary input signal x(n) and clipping threshold A are the same as those illustrated in FIG. 4. The attenuation functions obtained using clipping c(n) and peak windowing b(n) are also shown in FIG. 5. The window function w(n) is defined as $$w(n) = e^{-4.5 \frac{n^2}{\left(\frac{L-1}{2}\right)^2 + 1}} \quad (10)$$

with window width L=23. In the example of FIG. 5, for the first three peaks above the clipping threshold A in the envelope of the input signal x(n), over-attenuation occurs, and for the fourth peak (which is a double peak), equation (9) is not satisfied, so y(n) exceeds the clipping threshold A (under-attenuation).

To obtain a better smoothed complementary attenuation function b(n) and thereby overcome the drawbacks of the peak windowing method, a number of techniques may be used. One is to replace the summing in Equation (6) with a maximum operation:

$$\bar{b}(n) = \max_i a_i w(n - n_i) \quad (11)$$

That is, the smoothed complementary attenuation function $\bar{b}(n)$ is obtained by taking the maximal envelope of the weighted windows w(n) without superposition, as required by Equation (6). In this way, the over-attenuation problem can be solved. However, to eliminate under-attenuation, and thereby ensure that the envelope of the output signal y(n) does not exceed the clipping threshold A, extra effort must be taken, such as improving the peak detection and/or introducing a feedback structure in the calculation of the smoothed complementary attenuation function $\bar{b}(n)$. These extra efforts increase the complexity of the peak windowing method.

Figure 6:
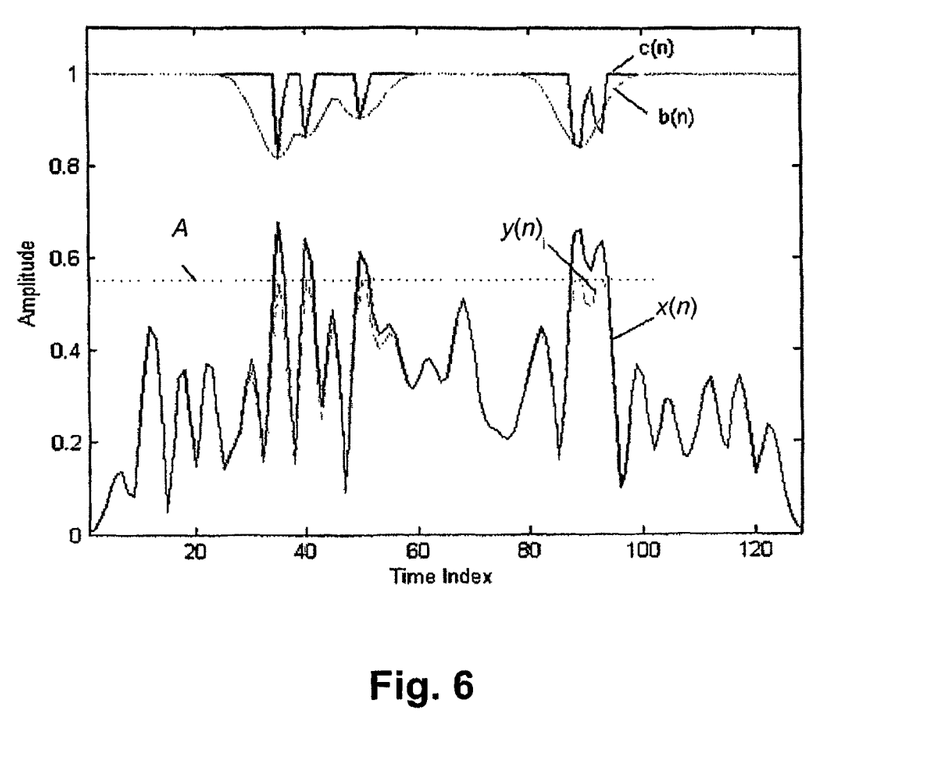
FIG. 6 shows the envelopes of an exemplary input signal to and output signal from an alternative peak windowing method of PAPR reduction.

FIG. 6 shows the envelopes of an exemplary input signal x(n) to and output signal y(n) from the peak windowing method using the attenuation function based on the alternative smoothed complementary attenuation function $\bar{b}(n)$ obtained using equation (11). The exemplary input signal x(n) and clipping threshold A are the same as those illustrated in FIG. 4. FIG. 6 shows that the over-attenuation problem is solved for the first three peaks in x(n). However, for the fourth peak the condition (9) is still not satisfied, so y(n) still exceeds the clipping threshold A.

Figure 7:
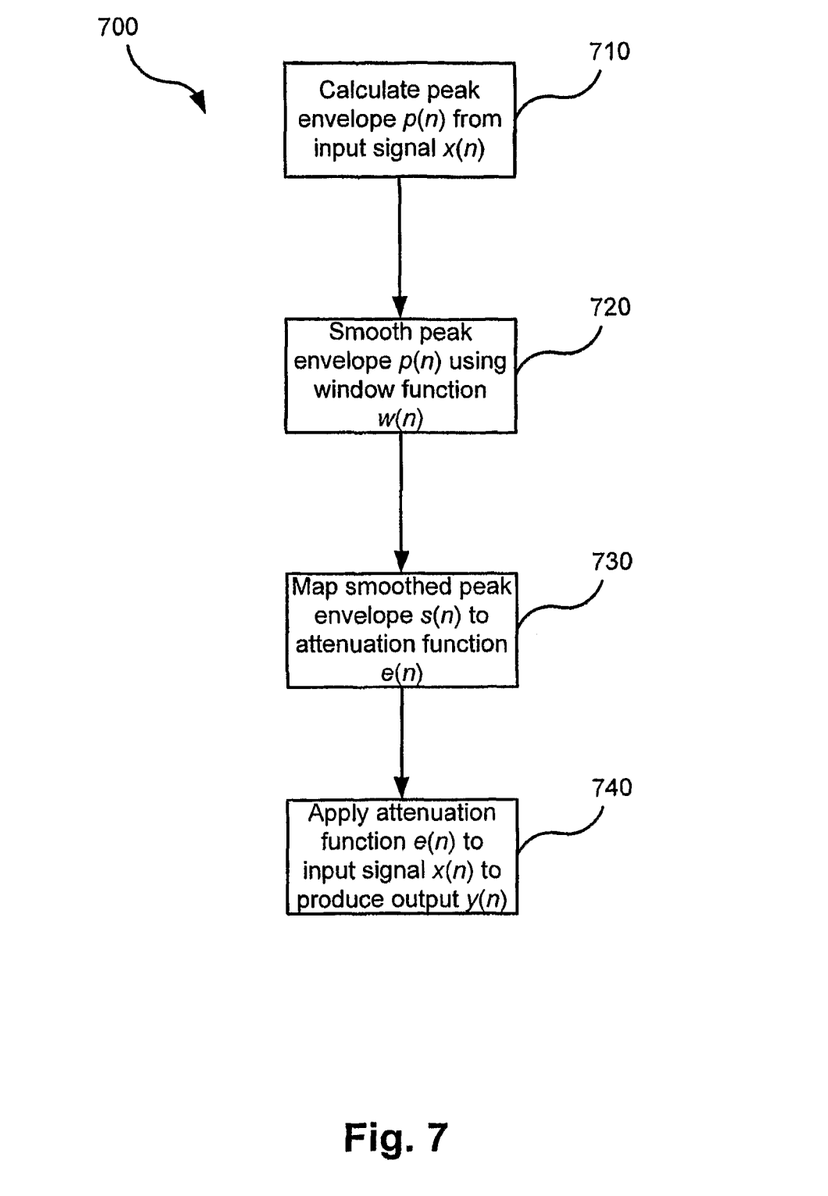
FIG. 7 is a flow chart illustrating a method of reducing the PAPR of an input signal according to one embodiment.

FIG. 7 is a flow chart illustrating a method 700 of reducing the PAPR of an input signal x(n) according to one embodiment. The method 700 is carried out by the PAPR reduction module 120 of the transmitter 100 of FIG. 1, or the PAPR reduction module 240 of the transmitter 200 of FIG. 2. The method 700, referred to herein as the peak envelope smoothing method, is a fundamentally different approach from the peak windowing method described above. The method 700 neither requires peak detection of the complementary attenuation function $\bar{c}(n)$ based on clipping, nor tries to smooth the complementary attenuation function $\bar{c}(n)$. Instead, the method 700 simply calculates and smoothes a peak envelope of the envelope of the input signal x(n), and maps the smoothed peak envelope to an attenuation function.

The method 700 starts at step 710 where the PAPR reduction module calculates a peak envelope p(n) from the envelope of the input signal x(n) using the clipping threshold A. In one implementation, the calculation is a simple clipping operation, as follows:

$$p(n) = \begin{cases} 0, & \text{if } |x(n)| \leq A \\ |x(n)| - A, & \text{if } |x(n)| > A \end{cases} \quad (12)$$

In the next step 720, the PAPR reduction module smoothes the peak envelope p(n) using a window function w(n). In one implementation of step 720, the smoothing is a convolution operation:

$$s(n) = \sum_{i=n-\frac{L-1}{2}}^{n+\frac{L-1}{2}} p(i)w(n-i) \quad (13)$$

where L is the (odd) width of the window function w(n). The window width L is typically between 10 and 30 samples. In another implementation of step 720, the smoothing is a "maximal envelope" operation as in equation (11):

$$s(n) = \sum_{i=n-\frac{L-1}{2}}^{n+\frac{L-1}{2}} p(i)w(n-i) \quad (14)$$

Step 730 follows, at which the PAPR reduction module maps the smoothed peak envelope s(n) to an attenuation function e(n) using the clipping threshold A. In one implementation, the mapping is as follows:

$$e(n) = \frac{A}{s(n) + A} \quad (15)$$

Finally, at step 740, the PAPR reduction module applies the attenuation function e(n) to the input signal x(n) to obtain the output signal y(n):

$$y(n) = e(n)x(n) \quad (16)$$

In an alternative implementation of the step 730, the attenuation function e(n) is calculated using a different linear or non-linear function of s(n) and A.

In Equation (12), the signal envelope |x(n)| is used to calculate the peak envelope p(n). When x(n) is a complex signal, |x(n)| involves the square root operation, which is costly in a hardware implementation. In addition, the attenuation function calculation in equation (15) requires a division operation, which is also costly in a hardware implementation. To reduce hardware implementation complexity, an alternative implementation of the steps 710 to 730 calculates the attenuation function e(n) as follows.

In step 710, the squared values of the input signal envelope and the clipping threshold, $|x(n)|^2$ and $A^2$ are used to calculate a squared peak envelope $p^2(n)$ $$p^2(n) = \begin{cases} 0, & \text{if } |x(n)|^2 \leq A^2 \\ |x(n)|^2 - A^2, & \text{if } |x(n)|^2 > A^2 \end{cases} \quad (17)$$

Then in step 720, a smoothed squared peak envelope $s^2(n)$ is obtained by a convolution operation on the squared peak envelope $p^2(n)$:

$$s^2(n) = \sum_{i=n-\frac{L-1}{2}}^{n+\frac{L-1}{2}} p^2(i)w(n-i) \quad (18)$$

In a further alternative implementation of step 720, the smoothed squared peak envelope $s^2(n)$ is obtained by a "maximal envelope" operation on the squared peak envelope $p^2(n)$:

$$s^2(n) = \max_{i=n-\frac{L-1}{2}}^{n+\frac{L-1}{2}} p^2(i)w(n-i) \quad (19)$$

where L and w(n) are defined as before.

Finally, in step 730, the attenuation function e(n) is calculated as $$e(n) = \sqrt{\frac{A^2}{s^2(n) + A^2}} = \sqrt{\frac{1}{\frac{s^2(n)}{A^2} + 1}} \quad (20)$$

A look-up table can be used to map the normalised smoothed squared peak envelope $$\frac{s^2(n)}{A^2}$$

to e(n) according to Eq. (20), and thus both the square root operation and division are not needed.

The peak envelope smoothing method 700 has several advantages over the peak windowing method described above. Firstly, it may be shown that provided the window function w(n) is non-negative, the smoothed peak envelope s(n) is also non-negative, so the attenuation function e(n) is always in the range $0 \leq e(n) \leq 1$. This contrasts with the attenuation function b(n) obtained by the peak windowing method based on the complementary attenuation function, which may be negative as mentioned previously.

Secondly, it may also be shown that, provided the window function w(n) is non-negative, the attenuation function e(n) obtained by the peak envelope smoothing method 700 always satisfies the condition e(n)≤c(n), where c(n) is the attenuation function obtained by the clipping method, (The two attenuation functions are equal if there is no smoothing, so that s(n)=p(n)). This ensures that the envelope of the output signal y(n) never exceeds the clipping threshold A (i.e. no under-attenuation). This is not always the case for the peak windowing method, as mentioned above.

Thirdly, the peak envelope smoothing method 700 is simpler than the peak windowing method described above, since no peak detection or other extra effort is necessary to satisfy the requirements of a valid attenuation function.

Figure 8:
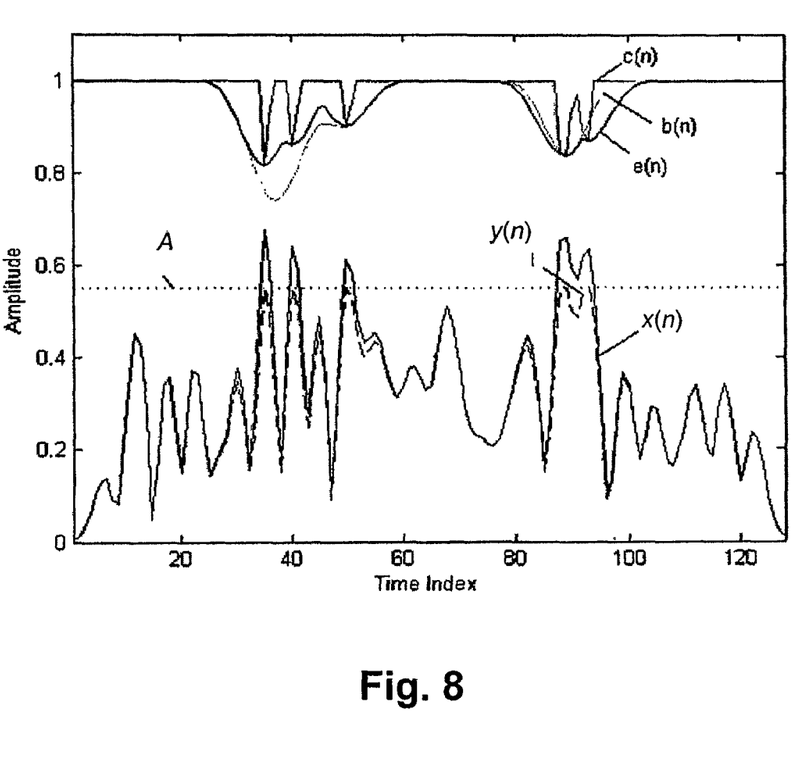
FIG. 8 shows the envelopes of an exemplary input signal to and output signal from the PAPR reduction method of FIG. 7.

FIG. 8 shows the envelopes of an exemplary input signal x(n) to and output signal y(n) from the peak envelope smoothing method 700 of FIG. 7. The input signal x(n), clipping threshold A, and window function w(n) are the same as those used in FIG. 5. The attenuation functions obtained using the clipping method (c(n)), the peak windowing method (b(n)), and the peak envelope smoothing method 700 of FIG. 7 (e(n)) (using equation (14) to smooth) are also shown. FIG. 8 shows that the attenuation function e(n) obtained using peak envelope smoothing does not have over-attenuation at signal peaks, and, unlike the attenuation function b(n) obtained using peak windowing, is always lower than or equal to the attenuation function c(n) obtained using the clipping method, thereby avoiding under-attenuation.

In between the above-threshold peaks of the input signal x(n), the attenuation function e(n) equals one, so the input signal x(n) is unchanged, preserving the average power of the input signal. When the input signal x(n) exceeds the clipping threshold A, the attenuation function e(n) assumes the values required to scale the peak(s) of x(n) back to A, so there is no over-attenuation if equation (14) is used at step 720. In between these two regions is a smooth transition where the attenuation function e(n) returns to one. The width of the transition region is determined by the width of the window function w(n). If the window function w(n) is too wide, the average power of the input signal x(n) will be reduced, so the PAPR will be greater than the desired value.

The arrangements described are applicable to the wireless communication industries.

The foregoing describes only some embodiments of the present invention, and modifications and/or changes can be made thereto without departing from the scope and spirit of the invention, the embodiments being illustrative and not restrictive.

The invention claimed is:

1. A wireless communication signal peak-to-average power ration reduction method comprising:
    calculating a peak envelope from an envelope of an input signal using a clipping threshold;
    smoothing the peak envelope using a window function;
    mapping the smoothed peak envelop to an attenuation function using the clipping threshold; and
    applying the attenuation function to the input signal.

2. A method according to claim 1, wherein the smoothing comprises convolving the peak envelope with the window function.

3. A method according to claim 1, wherein the smoothing comprises applying a maximal envelope operation.

4. A method according to claim 1, wherein the input signal is an orthogonal frequency division multiplexing signal.

5. A method according to claim 1, wherein the mapping comprises dividing the clipping threshold by the sum of the clipping threshold and the smoothed peak envelope.

6. A method according to claim 1, wherein the calculating comprises subtracting the clipping threshold from the envelope of the input signal and setting the result of the subtraction to zero if the envelope of the input signal is less than the clipping threshold.

7. A method according to claim 1, wherein the applying comprises multiplying the attenuation function by the input signal.

8. A wireless communication signal peak-to-average power reduction device comprising:
    a module configured to:
        calculate a peak envelope from an envelope of an input signal using a clipping threshold;
        smooth the peak envelope using a window function;
        map the smoothed peak envelop to an attenuation function using the clipping threshold; and
        apply the attenuation function to the input signal.

9. A wireless communication transmitter comprising:
    a mapping module configured to map and modulate input bits to a digital waveform;
    a wireless communication signal peak-to-average power reduction device according to claim 8 configured to be applied to the digital waveform;
    a digital-to-analog conversion module configured to convert the digital waveform to an analog waveform;
    a frequency conversion module configured to convert the analog waveform to a radio frequency signal; and
    a high power amplifier configured to amplify the radio frequency signal for transmission by an antenna.

10. A wireless communication transmitter according to claim 9, wherein the digital waveform is a digital baseband signal.

11. A wireless communication transmitter according to claim 9, wherein the digital waveform is an intermediate frequency signal.

12. A wireless communication transmitter comprising:
    a mapping module configured to map and modulate input bits to a digital waveform;
    a digital-to-analog conversion module configured to convert the digital waveform to an analog waveform;
    a frequency conversion module configured to convert the analog waveform to an intermediate frequency signal;
    a wireless communication signal peak-to-average power reduction device according to claim 8 configured to be applied to the intermediate frequency signal;
    a frequency conversion module configured to convert the intermediate frequency signal to a radio frequency signal; and
    a high power amplifier configured to amplify the radio frequency signal for transmission by an antenna.

13. A wireless communication transmitter according to claim 12, wherein the peak-to-average power reduction device further comprises an analog-to-digital conversion module on the input and a digital-to-analog conversion module on the output.

* * * * *